(12) United States Patent
Wang et al.

(10) Patent No.: US 12,484,461 B2
(45) Date of Patent: Nov. 25, 2025

(54) RESISTIVE MEMORY DEVICE AND MANUFACTURING METHOD THEREOF

(71) Applicant: UNITED MICROELECTRONICS CORP., Hsin-Chu (TW)

(72) Inventors: Wen-Jen Wang, Tainan (TW); Yu-Huan Yeh, Hsinchu (TW); Chuan-Fu Wang, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 518 days.

(21) Appl. No.: 17/970,560

(22) Filed: Oct. 20, 2022

(65) Prior Publication Data

US 2024/0107902 A1    Mar. 28, 2024

(30) Foreign Application Priority Data

Sep. 23, 2022 (TW) .................................. 111136151

(51) Int. Cl.
*H10N 70/00* (2023.01)
*H01L 23/48* (2006.01)
*H10B 63/00* (2023.01)

(52) U.S. Cl.
CPC ......... *H10N 70/841* (2023.02); *H01L 23/481* (2013.01); *H10B 63/00* (2023.02); *H10N 70/061* (2023.02)

(58) Field of Classification Search
CPC .. H10N 70/841; H10N 70/061; H10N 70/063; H10N 70/826; H10N 70/20; H10N 70/8833; H01L 23/481; H10B 63/00; H10B 63/80
See application file for complete search history.

(56) References Cited

U.S. PATENT DOCUMENTS

| | | | |
|---|---|---|---|
| 8,446,752 B2* | 5/2013 | Sun | G11C 11/16 365/163 |
| 10,504,963 B2* | 12/2019 | Yang | H10N 70/063 |
| 2024/0188306 A1* | 6/2024 | Wang | H10N 70/826 |
| 2024/0260490 A1* | 8/2024 | Wang | H10N 70/011 |

* cited by examiner

*Primary Examiner* — Allison Bernstein
(74) *Attorney, Agent, or Firm* — Winston Hsu

(57) ABSTRACT

A resistive memory device includes a dielectric layer, a via connection structure, a stacked structure, and an insulating structure. The via connection structure is disposed in the dielectric layer. The stacked structure is disposed on the via connection structure and the dielectric layer. The insulating structure penetrates through the stacked structure in a vertical direction and divides the stacked structure into a first memory cell unit and a second memory cell unit. The first memory cell unit includes a first bottom electrode, and the second memory cell unit includes a second bottom electrode separated from the first bottom electrode by the insulating structure. The via connection structure is electrically connected with the first bottom electrode and the second bottom electrode.

20 Claims, 13 Drawing Sheets

RESISTIVE MEMORY DEVICE AND MANUFACTURING METHOD THEREOF

BACKGROUND OF THE INVENTION

1. Field of the Invention

The present invention relates to a resistive memory device and a manufacturing method thereof, and more particularly, to a resistive memory device including an insulating structure and a manufacturing method thereof.

2. Description of the Prior Art

Semiconductor memory devices are used in computer and electronics industries as a means for retaining digital information or data. Typically, the semiconductor memory devices are divided into volatile and non-volatile memory devices. The volatile memory device is a computer memory that loses its stored data when power to the operation is interrupted. Comparatively, in the non-volatile memory device, the stored data will not be lost when the power supply is interrupted. The resistive random access memory (RRAM) is a kind of non-volatile memory technology having the characteristics of low operating voltage, low power consumption, and high writing speed and is regarded as a memory structure that can be applied to many electronic devices.

SUMMARY OF THE INVENTION

A resistive memory device and a manufacturing method thereof are provided in the present invention. An insulating structure penetrating through a stacked structure is used to divide the stacked structure into two memory cell units separated from each other. The purposes of shrinking the dimension of a single memory cell unit, increasing the density of the memory cell units, and/or improving operation efficiency may be achieved accordingly.

According to an embodiment of the present invention, a resistive memory device is provided. The resistive memory device includes a dielectric layer, a via connection structure, a stacked structure, and an insulating structure. The via connection structure is disposed in the dielectric layer, and the stacked structure is disposed on the via connection structure and the dielectric layer. The insulating structure penetrates through the stacked structure in a vertical direction and divides the stacked structure into a first memory cell unit and a second memory cell unit. The first memory cell unit comprises a first bottom electrode, the second memory cell unit comprises a second bottom electrode separated from the first bottom electrode by the insulating structure, and the via connection structure is electrically connected with the first bottom electrode and the second bottom electrode.

According to an embodiment of the present invention, a manufacturing method of a resistive memory device is provided. The manufacturing method includes the following steps. A via connection structure is formed in a dielectric layer. A stacked structure is formed on the via connection structure and the dielectric layer. An insulating structure is formed. The insulating structure penetrates through the stacked structure in a vertical direction and divides the stacked structure into a first memory cell unit and a second memory cell unit. The first memory cell unit comprises a first bottom electrode, the second memory cell unit comprises a second bottom electrode separated from the first bottom electrode by the insulating structure, and the via connection structure is electrically connected with the first bottom electrode and the second bottom electrode.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-10 are schematic drawings illustrating a manufacturing method of the resistive memory device according to the first embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

FIG. 12 and FIG. 13 are schematic drawings illustrating a manufacturing method of the resistive memory device according to the second embodiment of the present invention, wherein FIG. 13 is a schematic drawing in a step subsequent to FIG. 12.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
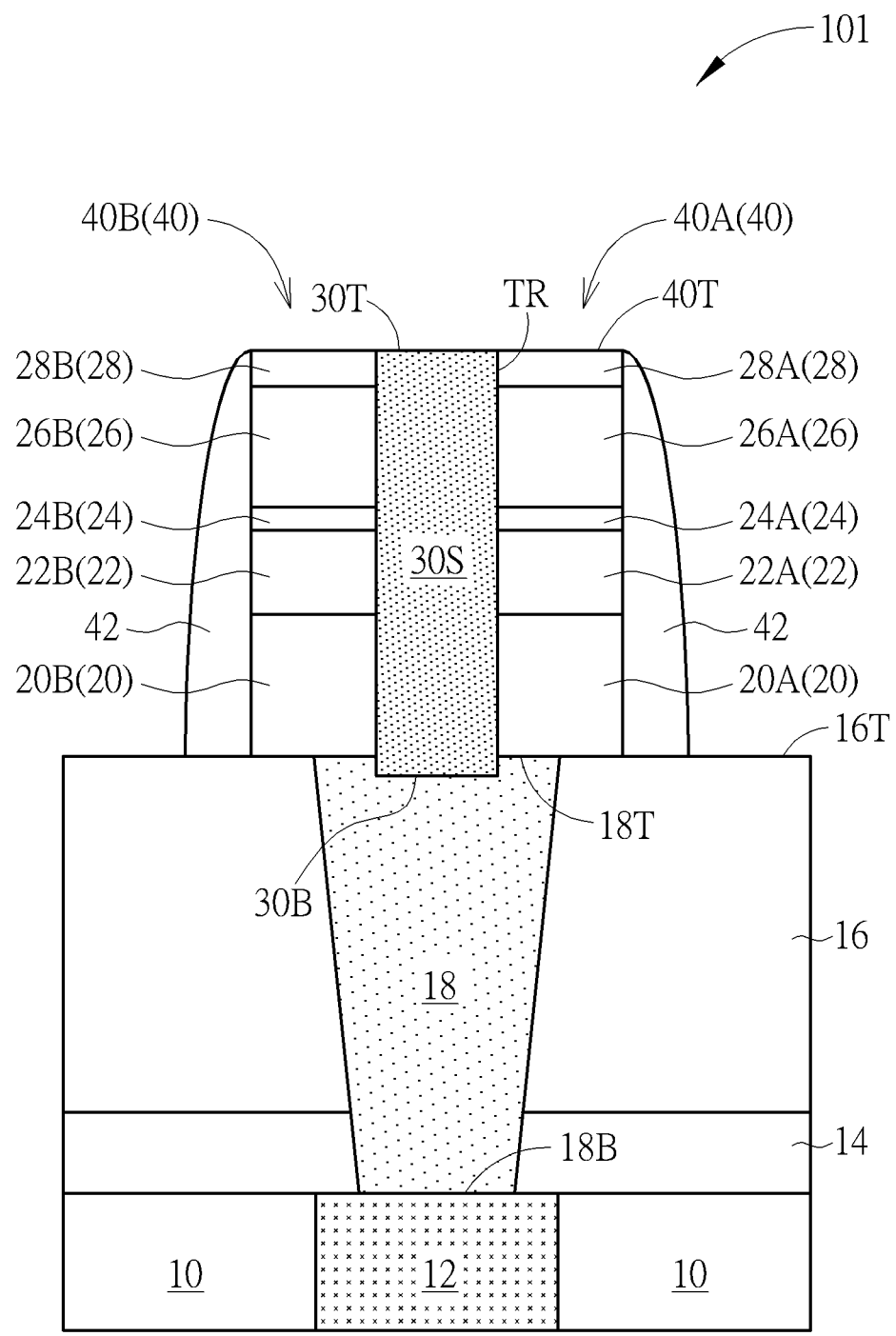
FIG. 1 is a schematic drawing illustrating a resistive memory device according to a first embodiment of the present invention.
Figure 1:
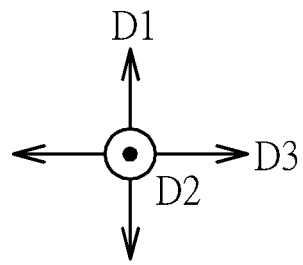

Please refer to FIG. 1. FIG. 1 is a schematic drawing illustrating a resistive memory device 101 according to a first embodiment of the present invention. As shown in FIG. 1, the resistive memory device 101 includes a dielectric layer 16, a via connection structure 18, a stacked structure 40, and an insulating structure 30S. The via connection structure 18 is disposed in the dielectric layer 16, and the stacked structure 40 is disposed on the via connection structure 18 and the dielectric layer 16. The insulating structure 30S penetrates through the stacked structure 40 in a vertical direction (such as a direction D1 illustrated in FIG. 1) and divides the stacked structure 40 into a first memory cell unit 40A and a second memory cell unit 40B. The first memory cell unit 40A comprises a first bottom electrode 20A, the second memory cell unit 40B comprises a second bottom electrode 20B separated from the first bottom electrode 20A by the insulating structure 30S, and the via connection structure 18 is electrically connected with the first bottom electrode 20A and the second bottom electrode 20B. The dimension of a single memory cell unit may be reduced by using the insulating structure dividing the stacked structure into two memory cell units separated from each other, and the distribution density of the memory cell units may be increased accordingly.

In some embodiments, the resistive memory device 101 may further include a dielectric layer 10, an electrically conductive line 12, and a dielectric layer 14. The electrically conductive line 12 may be disposed in the dielectric layer 10, the dielectric layer 14 may be disposed between the dielectric layer 16 and the dielectric layer 10, and the via connection structure 18 may penetrate through the dielectric layer 16 and the dielectric layer 14 located on the electrically conductive line 12 in the direction D1. A bottom surface 18B of the via connection structure 18 may contact and be electrically connected with the electrically conductive line 12, and a top surface 18T of the via connection structure 18 and a top surface 16T of the dielectric layer 16 may be substantially coplanar, but not limited thereto. It is worth noting that, in this description, a top surface of a specific component may include the topmost surface of this component in the direction D1, and a bottom surface of a specific component may include the bottommost surface of this component in the direction D1, but not limited thereto. In some embodiments, the dielectric layer 10, the dielectric layer 14, and the dielectric layer 16 may include silicon oxide, silicon nitride, nitrogen doped carbide (NDC), fluorosilicate glass (FSG), or other suitable dielectric materials, and the via connection structure 18 and the electrically conductive line 12 may include a low electrical resistivity material and a barrier layer, but not limited thereto. The low electrical resistivity material described above may include a material with relatively low electrical resistivity, such as copper, aluminum, tungsten, and so forth, and the barrier layer described above may include titanium nitride, tantalum nitride, or other suitable electrically conductive barrier materials, but not limited thereto. In some embodiments, the dielectric layer 10 may be disposed on a substrate (not illustrated), and the substrate may include a semiconductor substrate, such as silicon substrate, silicon germanium substrate, silicon-on-insulator (SOI) substrate, or a substrate made of other suitable materials. In addition, before the step of forming the dielectric layer 10, other units (such as transistors) and/or other circuits (not illustrated) may be formed on the substrate described above, and the electrically conductive line 12 may be electrically connected downwardly with the units and/or the circuits on the substrate, but not limited thereto. In some embodiments, the manufacturing method of the resistive memory device 101 may be integrated with the back end of line (BEOL) process in the semiconductor manufacturing process. The dielectric layer 10, the dielectric layer 14, and the dielectric layer 16 described above may be regarded as interlayer dielectric layers formed in the BEOL process, and the electrically conductive line 12 and the via connection structure 18 described above may be regarded as a portion of an interconnection structure formed in the BEOL process, but not limited thereto.

In some embodiments, the vertical direction described above (such as the direction D1) may be regarded as a thickness direction of the dielectric layer 10 and/or the dielectric layer. The dielectric layer 10 may have a top surface and a bottom surface opposite to the top surface in the direction D1, and the dielectric layer 16, the via connection structure 18, the stacked structure 40, and the insulating structure 30S may be disposed at the side of the top surface of the dielectric layer 10. Horizontal directions substantially orthogonal to the direction D1 (such as a direction D2 and a direction D3 illustrated in FIG. 1 and other directions orthogonal to the direction D1) may be substantially parallel with the top surface and/or the bottom surface of the dielectric layer 10, but not limited thereto. In this description, a distance between the bottom surface of the dielectric layer 10 and a relatively higher location and/or a relatively higher part in the vertical direction (such as the direction D1) may be greater than a distance between the bottom surface of the dielectric layer 10 and a relatively lower location and/or a relatively lower part in the direction D1. The bottom or a lower portion of each component may be closer to the bottom surface of the dielectric layer 10 in the direction D1 than the top or upper portion of this component. Another component disposed above a specific component may be regarded as being relatively far from the bottom surface of the dielectric layer 10 in the direction D1, and another component disposed under a specific component may be regarded as being relatively close to the bottom surface of the dielectric layer 10 in the direction D1.

In some embodiments, the stacked structure 40 may include a first electrically conductive layer 20, a variable resistance material 22, and a second electrically conductive layer 26 disposed stacked in the direction D1. The first electrically conductive layer 20 may be disposed on the dielectric layer 16 and the via connection structure 18, the variable resistance material 22 may be disposed above the first electrically conductive layer 20 in the direction D1, and the variable resistance material 22 may be disposed between the first electrically conductive layer 20 and the second electrically conductive layer 26 in the direction D1. The first electrically conductive layer 20 and the second electrically conductive layer 26 may respectively include an electrically conductive material, such as platinum, tungsten, silver, copper, titanium, tantalum, an alloy of the materials described above, electrically conductive nitride of the materials described above, or other suitable electrically conductive materials. The variable resistance material 22 may include metal oxide, such as transition metal oxide, perovskite oxide, or other suitable variable resistance materials. The insulating structure 30S may penetrate through the second electrically conductive layer 26, the variable resistance material 22, and the first electrically conductive layer 20 in the direction D1 and divide the second electrically conductive layer 26, the variable resistance material 22, and the first electrically conductive layer 20 into two portions separated from each other, respectively.

In some embodiments, the first memory cell unit 40A may further include a first top electrode 26A and a first variable resistance layer 22A, and the second memory cell unit 20B may further include a second top electrode 26B and a second variable resistance layer 22B. The first top electrode 26A and the first variable resistance layer 22A may be disposed above the first bottom electrode 20A in the direction D1, and the first variable resistance layer 22A may be disposed between the first bottom electrode 20A and the first top electrode 26A in the direction D1. The second top electrode 26B and the second variable resistance layer 22B may be disposed above the second bottom electrode 20B in the direction D1, and the second variable resistance layer 22B may be disposed between the second bottom electrode 20B and the second top electrode 26B in the direction D1. In some embodiments, the first bottom electrode 20A may be a first portion of the first electrically conductive layer 20, the second bottom electrode 20B may be a second portion of the first electrically conductive layer 20, and the first portion of the first electrically conductive layer 20 and the second portion of the first electrically conductive layer 20 may be separated from each other by the insulating structure 30S. Therefore, the material composition of the first bottom electrode 20A may be identical to that of the second bottom electrode 20B, and the thickness of the first bottom electrode 20A may be substantially equal to the thickness of the second bottom electrode 20B, but not limited thereto. In some embodiments, the first variable resistance layer 22A may be a first portion of the variable resistance material 22, the second variable resistance layer 22B may be a second portion of the variable resistance material 22, and the first portion of the variable resistance material 22 and the second portion of the variable resistance material 22 may be separated from each other by the insulating structure 30S. Therefore, the material composition of the first variable resistance layer 22A may be identical to that of the second variable resistance layer 22B, and the thickness of the first variable resistance layer 22A may be substantially equal to the thickness of the second variable resistance layer 22B, but not limited thereto. In some embodiments, the first top electrode 26A may be a first portion of the second electrically conductive layer 26, the second top electrode 26B may be a second portion of the second electrically conductive layer 26, and the first portion of the second electrically conductive layer 26 and the second portion of the second electrically conductive layer 26 may be separated from each other by the insulating structure 30S. Therefore, the material composition of the first top electrode 26A may be identical to that of the second top electrode 26B, and the thickness of the first top electrode 26A may be substantially equal to the thickness of the second top electrode 26B, but not limited thereto.

In each memory cell unit, each variable resistance material layer may be regarded as a switching medium in the resistive memory cell unit. The resistance of the resistive memory cell unit may be changed by applying suitable voltage to the top electrode and the bottom electrode in the stacked structure, and the resistive memory cell unit may switch to high resistance state (HRS) or low resistance state (LRS) for realizing the operation mode of the memory device, such as storing data, reading data, and resetting. Additionally, by using the insulating structure 30S dividing the stacked structure 40 into the first memory cell unit 40A and the second memory cell unit 40B separated from each other, the dimension of the single memory cell unit may be reduced for increasing the distribution density of the memory cell units. The operation time of the single memory cell unit may be relatively reduced by shrinking the dimension of the memory cell unit. For instance, the forming time required to form conductive path and switch to the low resistance state by applying voltage bias to the memory cell unit may be reduced by shrinking the dimension of the memory cell unit, and the operation efficiency may be enhanced accordingly.

In some embodiments, the stacked structure 40 may further include a barrier layer 24 and a capping layer 28. The barrier layer 24 may be disposed between the variable resistance material 22 and the second electrically conductive layer 26 in the direction D1 for blocking the material of the second electrically conductive layer 26 or other materials from entering the variable resistance material 22 and influencing the material characteristics of the variable resistance material 22 and/or reducing the amount of the material of the second electrically conductive layer 26 or other materials entering the variable resistance material 22 and influencing the material characteristics of the variable resistance material 22. The capping layer 28 may be disposed on the second electrically conductive layer 26. The barrier layer 24 may include iridium or other suitable barrier materials, and the capping layer 28 may include an oxide insulation material (such as silicon oxide) or other suitable insulation materials. In some embodiments, the first memory cell unit 40A may further include a first barrier layer 24A and a first capping layer 28A, and the second memory cell unit 40B may further include a second barrier layer 24B and a second capping layer 28B. The first barrier layer 24A may be disposed between the first variable resistance layer 22A and the first top electrode 26A in the direction D1, and the second barrier layer 24B may be disposed between the second variable resistance layer 22B and the second top electrode 26B in the direction D1. The first capping layer 28A may be disposed on the first top electrode 26A, and the second capping layer 28B may be disposed on the second top electrode 26B. In some embodiments, the first barrier layer 24A and the second barrier layer 24B may be two portions of the barrier layer 24 separated from each other by the insulating structure 30S. Therefore, the material composition of the first barrier layer 24A may be identical to that of the second barrier layer 24B, and the thickness of the first barrier layer 24A may be substantially equal to the thickness of the second barrier layer 24B, but not limited thereto. In some embodiments, the first capping layer 28A and the second capping layer 28B may be two portions of the capping layer 28 separated from each other by the insulating structure 30S. Therefore, the material composition of the first capping layer 28A may be identical to that of the second capping layer 28B, and the thickness of the first capping layer 28A may be substantially equal to the thickness of the second capping layer 28B, but not limited thereto. It is worth noting that, the stacked structure 40 in the present invention is not limited to the condition described above and other material layers may be disposed in the stacked structure 40 according to some design considerations. Relatively, other material layers may be disposed in each memory cell unit according to some design considerations also.

In some embodiments, the first memory cell unit 40A and the second memory cell unit 40B may be located at two opposite sides of the insulating structure 30S in a horizontal direction (such as the direction D3), and the insulating structure 30S may directly contact the first memory cell unit 40A and the second memory cell unit 40B. In other words, a sidewall of the insulating structure 30S may be directly connected with the first capping layer 28A, the first top electrode 26A, the first barrier layer 24A, the first variable resistance layer 22A, and the first bottom electrode 20A in the first memory cell unit 40A, and another sidewall of the insulating structure 30S may be directly connected with the second capping layer 28B, the second top electrode 26B, the second barrier layer 24B, the second variable resistance layer 22B, and the second bottom electrode 20B in the second memory cell unit 40B. The first memory cell unit 40A and the second memory cell unit 40B may be physically separated from each other by the insulating structure 30S. Therefore, no part of the first memory cell unit 40A is directly connected to any part of the second memory cell unit 40B. In addition, the insulating structure 30S may include a single layer or multiple layers of insulating materials, such as a nitride insulating material (silicon nitride, for example) or other suitable insulating materials (such as dielectric materials with low dielectric constant). In some embodiments, at least a portion of the insulating structure 30S is disposed on the via connection structure 18 in the direction D1, and a bottom surface 30B of the insulating structure 30S may be lower than the top surface 18T of the via connection structure 18 in the direction D1 for keeping the first bottom electrode 20A from being directly connected with the second bottom electrode 20B and/or strengthening the isolation performance between the first memory cell unit 40A and the second memory cell unit 40B, but not limited thereto. Additionally, the resistive memory device 101 may further include a spacer structure 42 disposed on a sidewall of the stacked structure 40, and the spacer structure 42 may include a single layer or multiple layers of dielectric materials, such as silicon nitride, silicon carbonitride, or other suitable dielectric materials.

Figure 2:
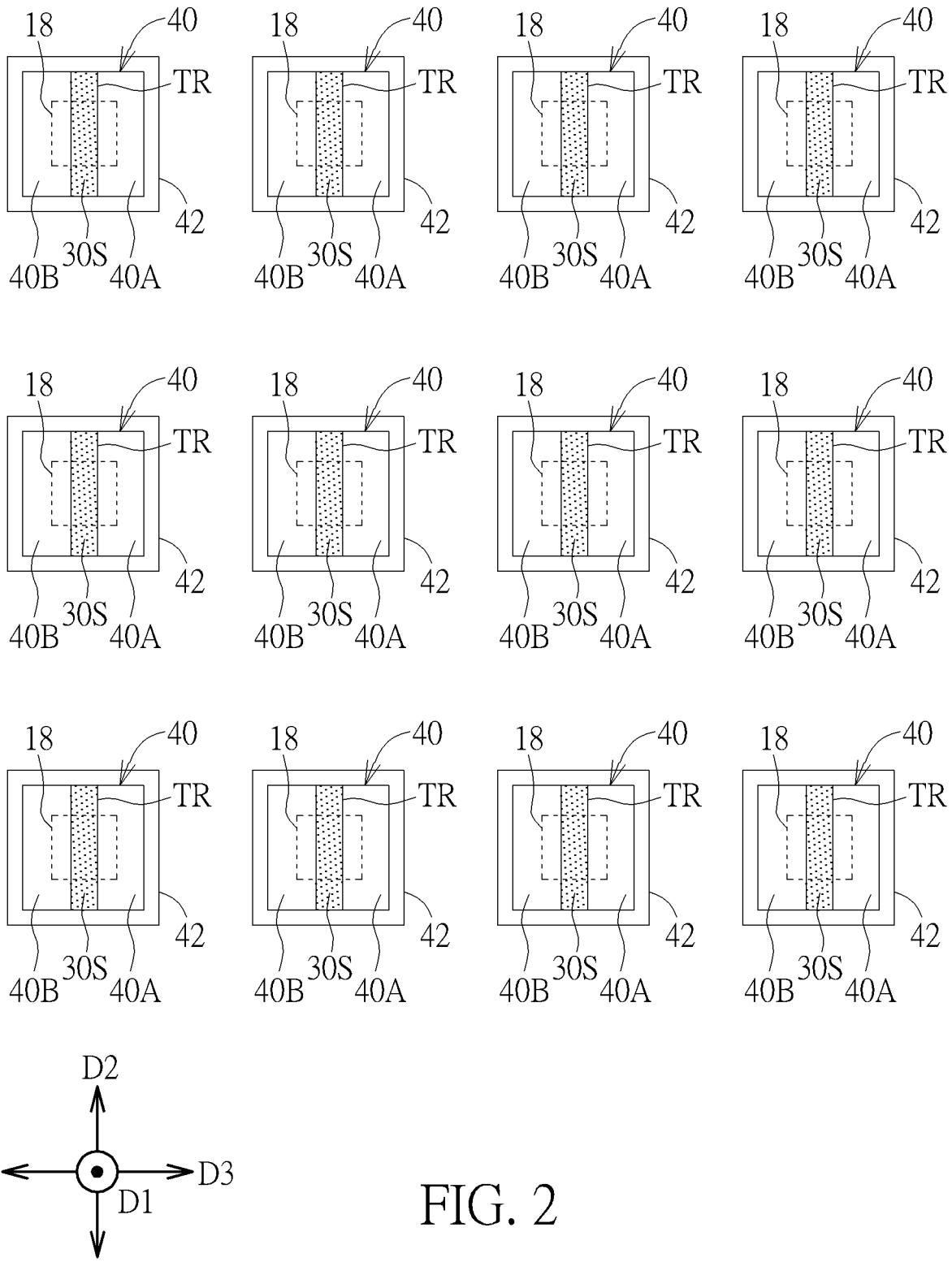
FIG. 2 is a top view schematic drawing illustrating a resistive memory device according to an embodiment of the present invention.

Please refer to FIG. 1 and FIG. 2. FIG. 2 is a top view schematic drawing illustrating a resistive memory device according to an embodiment of the present invention. As shown in FIG. 2 and FIG. 1, in some embodiments, the resistive memory device may include a plurality of the stacked structures 40 arranged in an array configuration, and each of the stacked structures 40 may be disposed on the corresponding via connection structure 18 in the direction D1. Each of the insulating structures 30S may be elongated in the direction D2, each of the stacked structures 40 may be divided into one first memory cell unit 40A and one second memory cell unit 40B separated from each other by the corresponding insulating structure 30S, and the projection area of each stacked structures 40 and the corresponding insulating structure 30S in the direction D1 may be greater than the projection area of each via connection structure 18 in the direction D1, but not limited thereto. In addition, each of the stacked structures 40 and the corresponding insulating structure 30S may be surrounded by the corresponding spacer structure 42 in the horizontal directions (such as the direction D2, the direction D3, and other directions perpendicular to the direction D1), and the insulating structure 30S may be directly connected with the spacer structure 42. In other words, the spacer structure 42 may be further disposed on two opposite sidewalls of the insulating structure 30S in the direction D2, but not limited thereto. It is worth noting that the structure and/or the arrangement illustrated in FIG. 2 may be applied to other embodiments of the present invention according to some design considerations.

Figure 3:
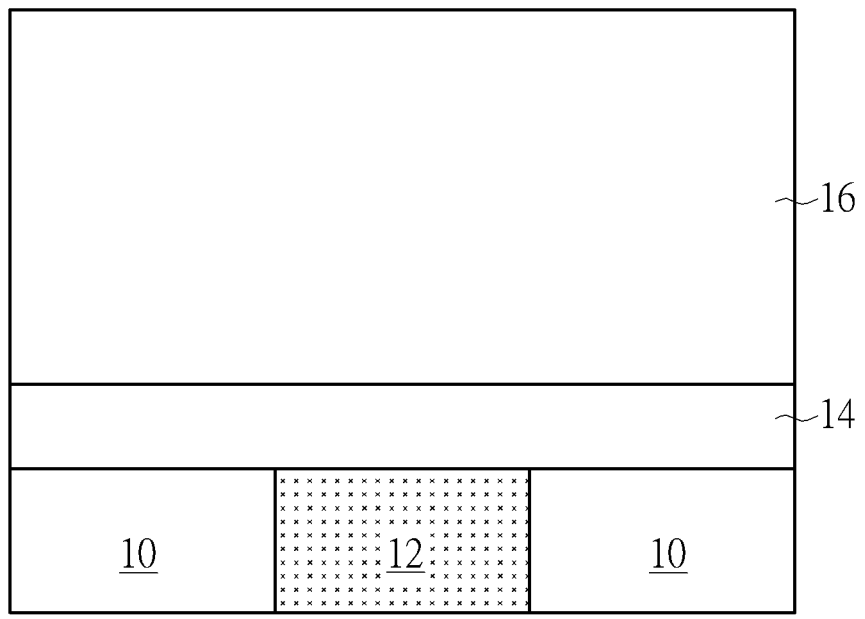
Figure 3:
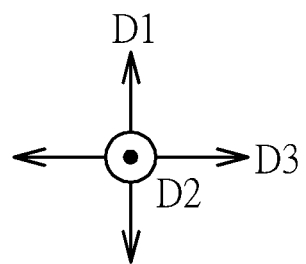
Figure 4:
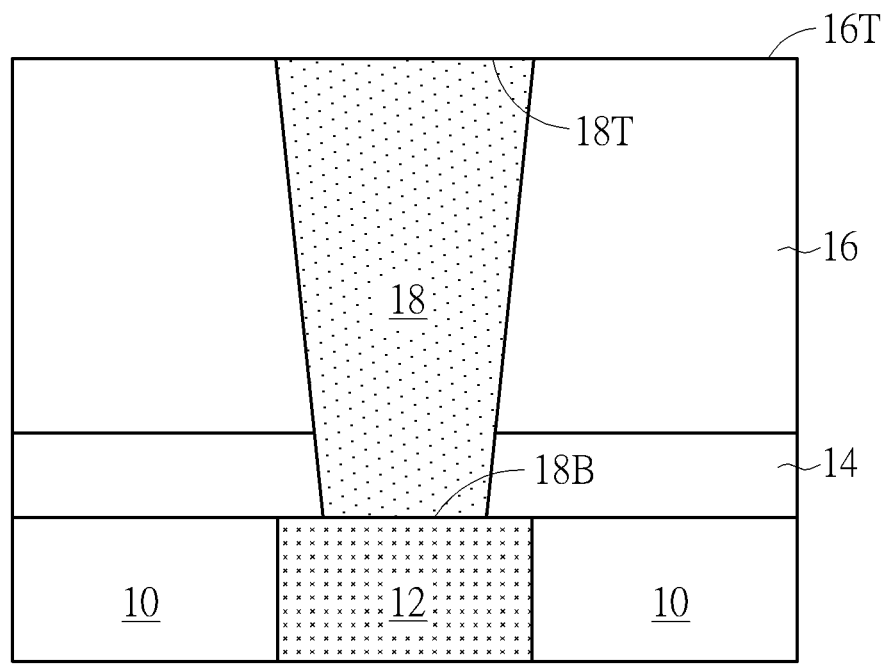
Figure 4:
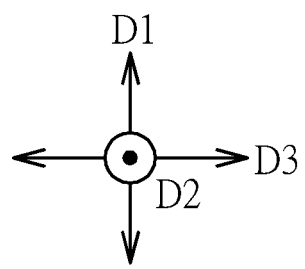
Figure 5:
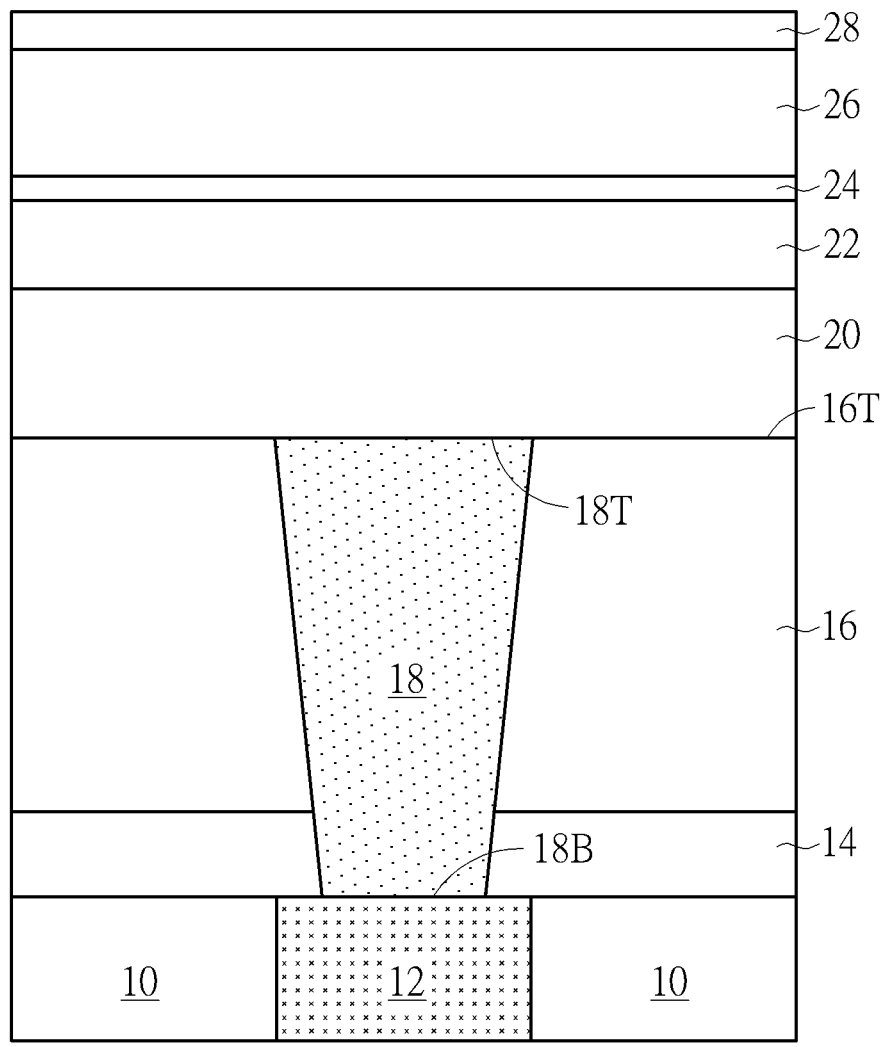
Figure 5:
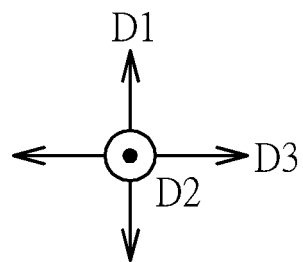
Figure 6:
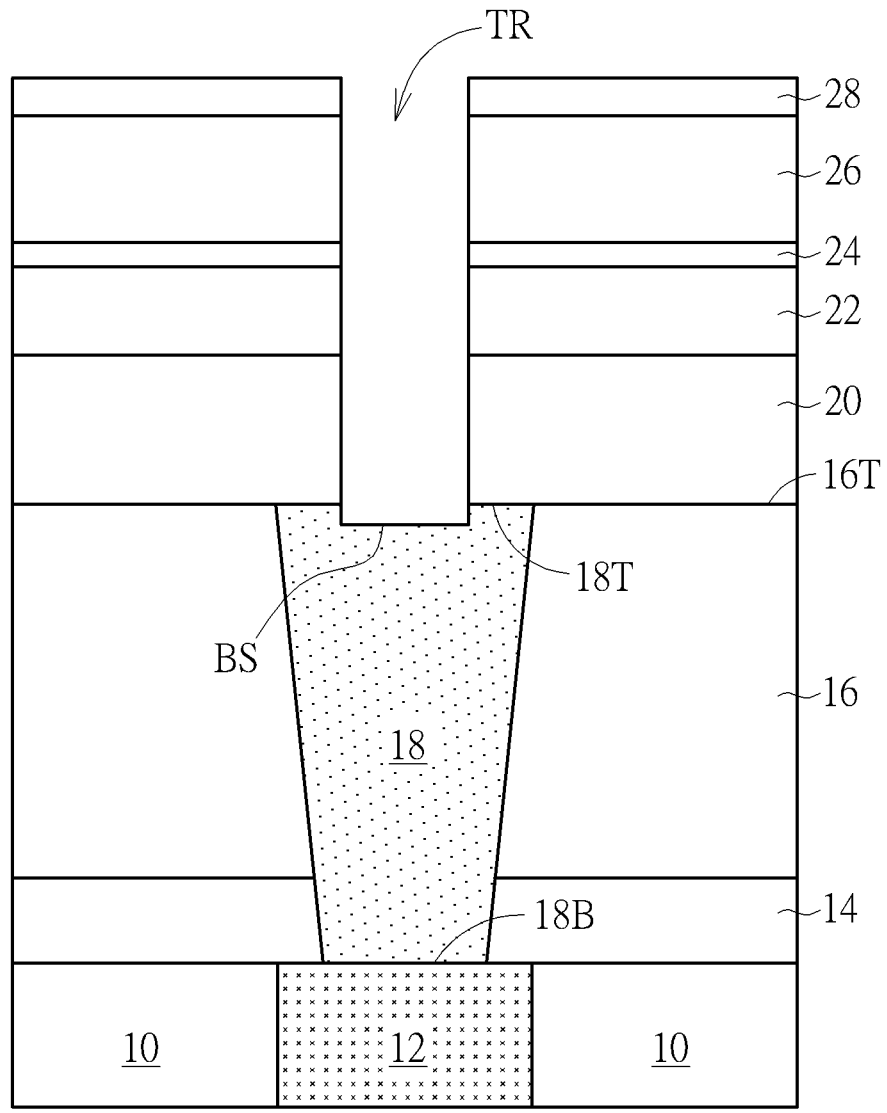
Figure 6:
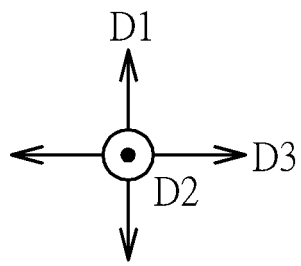
Figure 7:
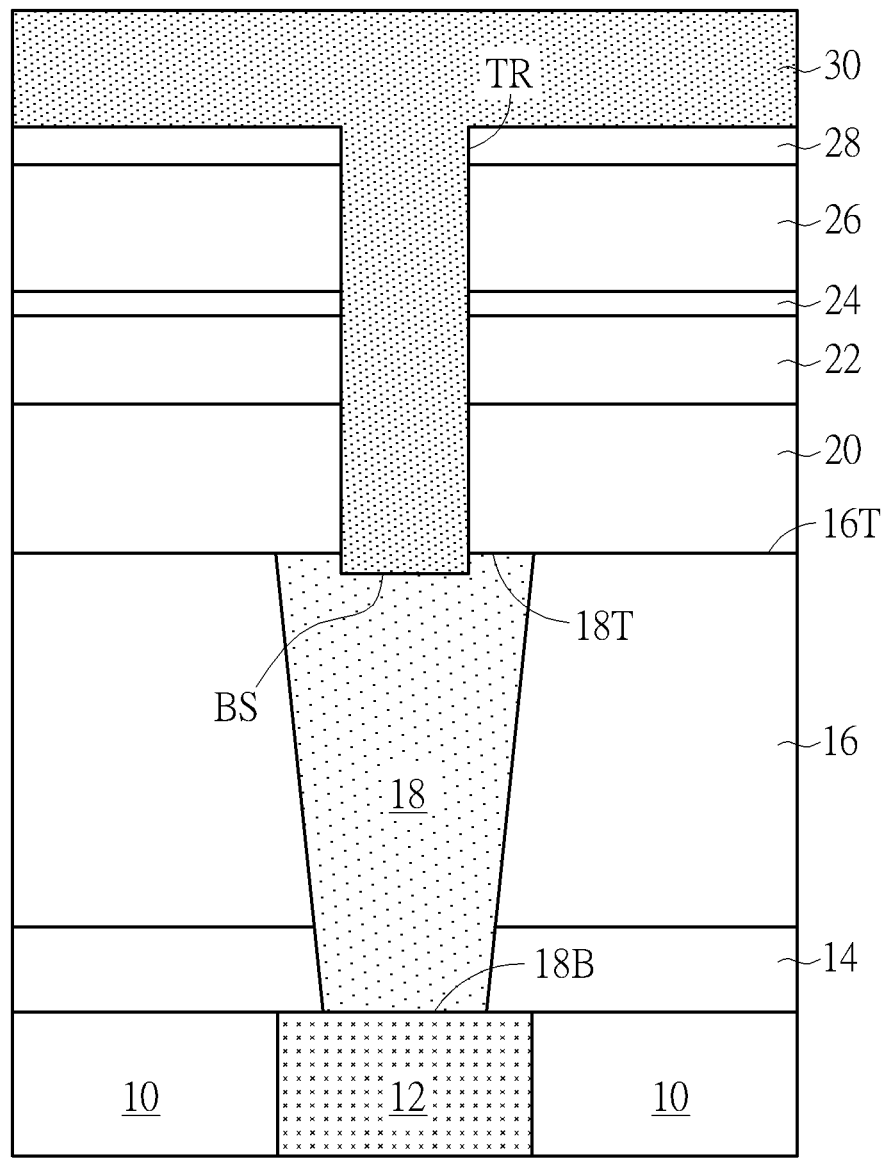
Figure 7:
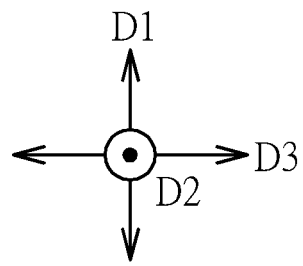
Figure 8:
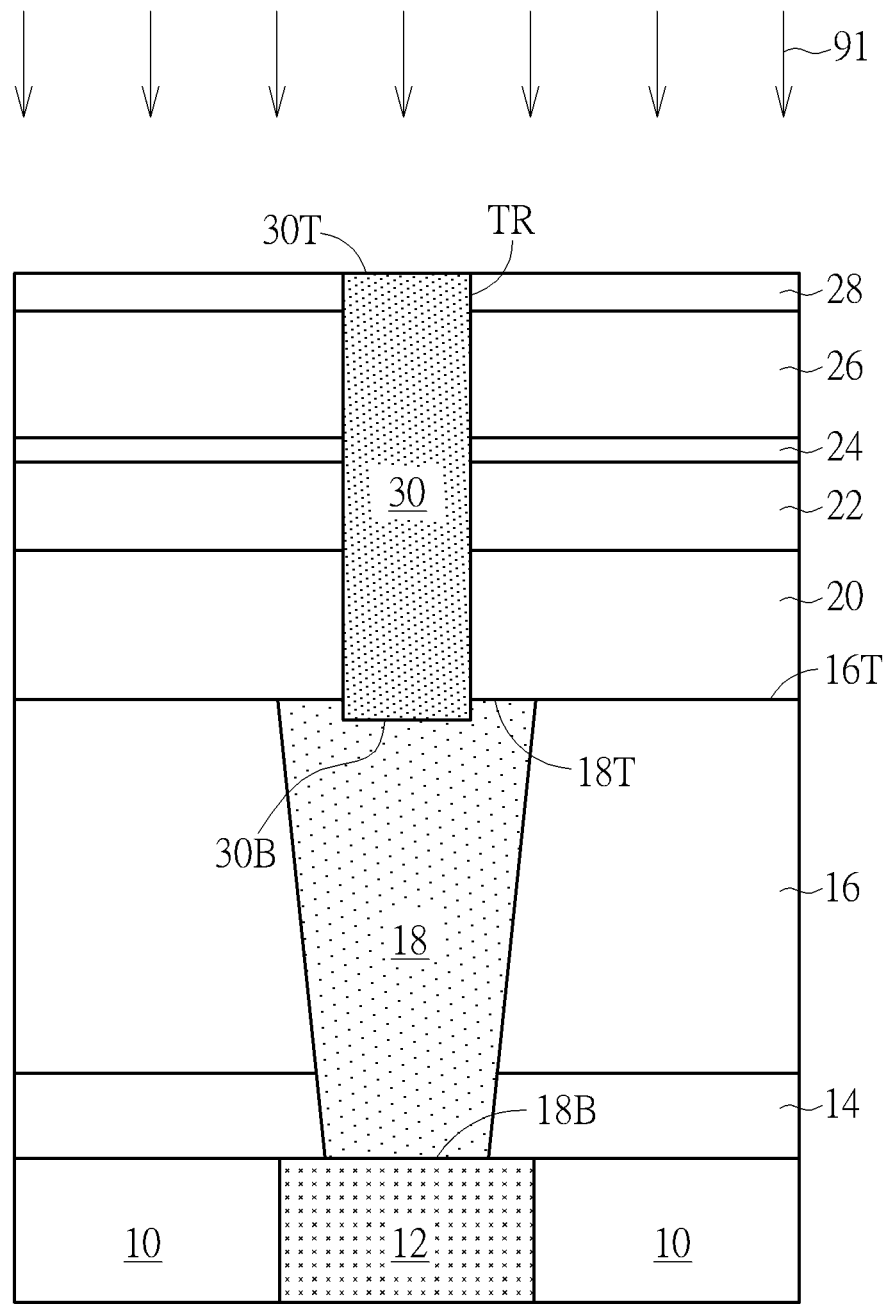
Figure 8:
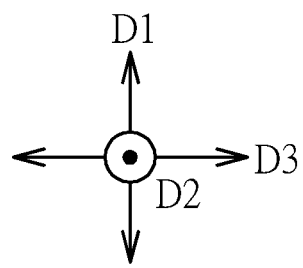
Figure 9:
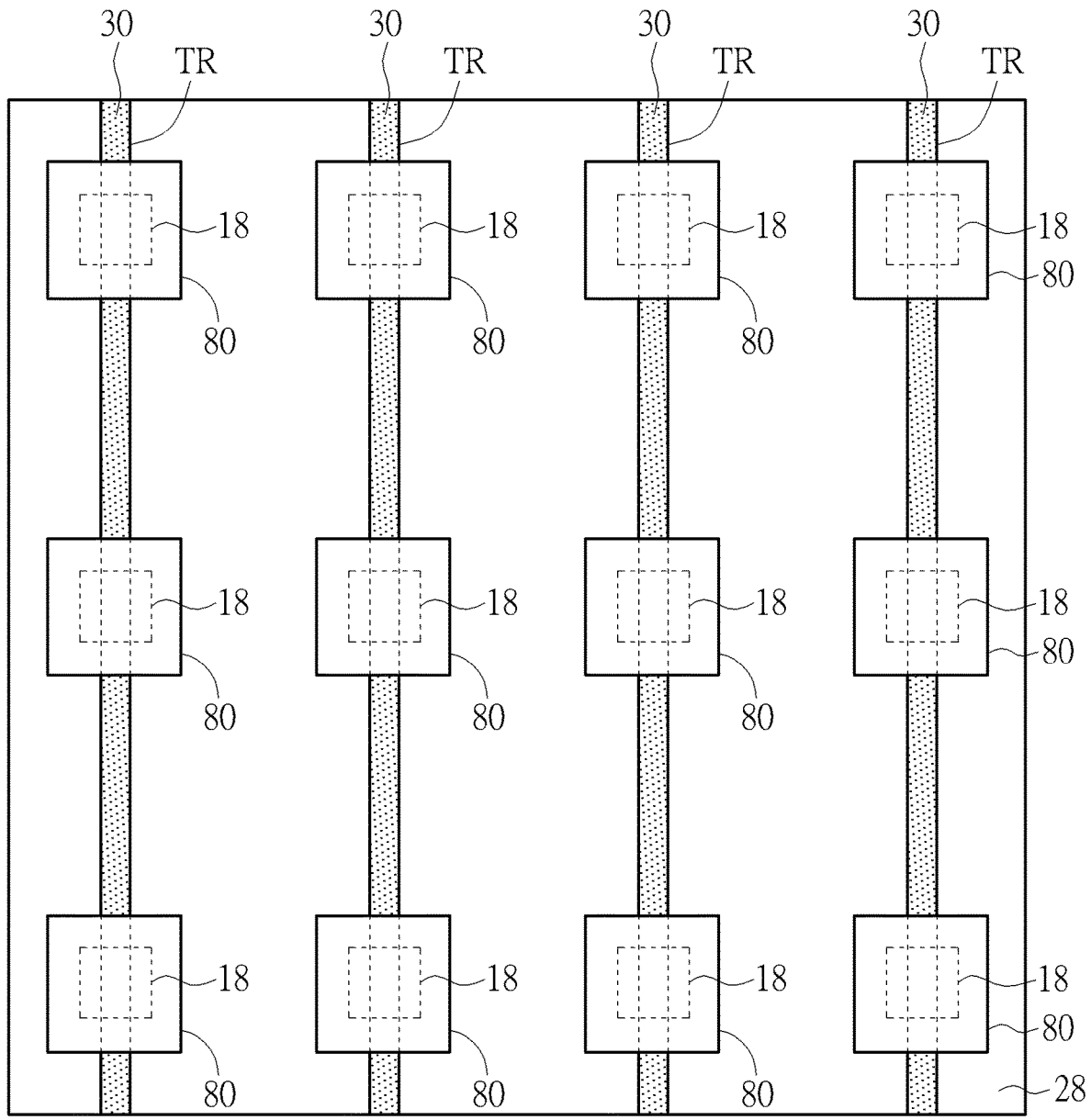
Figure 9:
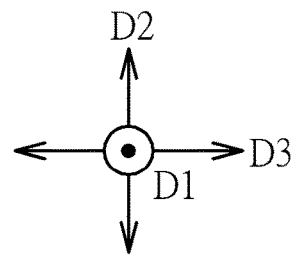
Figure 10:
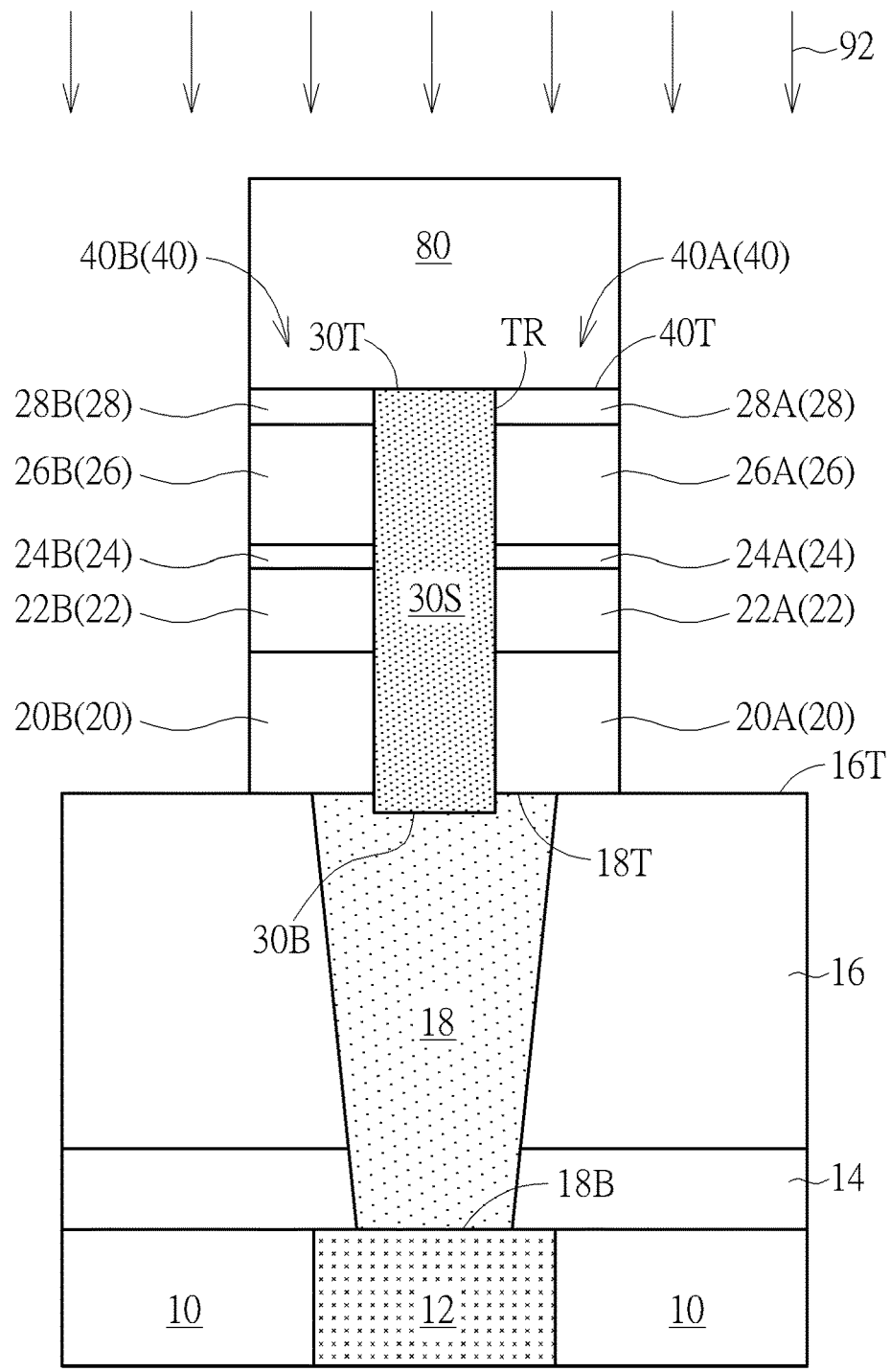

Please refer to FIG. 1 and FIGS. 3-10. FIGS. 3-10 are schematic drawings illustrating a manufacturing method of the resistive memory device according to the first embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 1 may be regarded as a schematic drawing in a step subsequent to FIG. 10, but not limited thereto. As shown in FIG. 1, the manufacturing method of the resistive memory device 101 may include the following steps. The via connection structure 18 is formed in the dielectric layer 16. The stacked structure 40 is formed on the via connection structure 18 and the dielectric layer 16. The insulating structure 30S is formed. The insulating structure 30S penetrates through the stacked structure 40 in the direction D1 and divides the stacked structure 40 into the first memory cell unit 40A and the second memory cell unit 40B. The first memory cell unit 40A includes the first bottom electrode 20A, the second memory cell unit 40B includes the second bottom electrode 20B separated from the first bottom electrode 20A by the insulating structure 30S, and the via connection structure 18 is electrically connected with the first bottom electrode 20A and the second bottom electrode 20B.

Specifically, the manufacturing method of the resistive memory device in this embodiment may include but is not limited to the following steps. As shown in FIG. 3, the dielectric layer 14 and the dielectric layer 16 may be formed on the dielectric layer 10 and the electrically conductive line 12 after the steps of forming the electrically conductive line 12 in the dielectric layer 10. As shown in FIG. 4, the via connection structure 18 may then be formed penetrating through the dielectric layer 16 and the dielectric layer 14 located above the electrically conductive line 12 in the direction D1 for contacting and being electrically connected with the electrically conductive line 12. In some embodiments, the via connection structure 18 may be formed by filling an opening penetrating through the dielectric layer 16 and the dielectric layer 14 with an electrically conductive material and performing a planarization process for removing the electrically conductive material located outside the opening, and the top surface 18T of the via connection structure 18 and the top surface 16T of the dielectric layer 16 may be substantially coplanar accordingly, but not limited thereto. As shown in FIG. 5, the first electrically conductive layer 20 may then be formed on the via connection structure 18 and the dielectric layer 16, the variable resistance material 22 may be formed on the first electrically conductive layer 20, and the second electrically conductive layer 26 may be formed on the variable resistance material 22. In some embodiments, before the step of forming the second electrically conductive layer 26, the barrier layer 24 may be formed on the variable resistance material 22, and the second electrically conductive layer 26 may be formed on the barrier layer 24. In addition, the capping layer 28 may be formed on the second electrically conductive layer 26, but not limited thereto. Subsequently, as shown in FIG. 6, the trench TR may be formed penetrating through the capping layer 28, the second electrically conductive layer 26, the barrier layer 24, the variable resistance material 22, and the first electrically conductive layer 20 in the direction D1. In some embodiments, a portion of the via connection structure 18 may be removed by the step of forming the trench TR (such as an etching process, but not limited thereto), and a bottom surface BS of the trench TR may be lower than the top surface 18T of the via connection structure 18 in the direction D1 accordingly, but not limited thereto. Subsequently, as shown in FIG. 7, an insulating material 30 may be formed. A portion of the insulating material 30 may be formed in the trench TR, and another portion of the insulating material 30 may be formed outside the trench TR. The insulating material 30 may include a nitride insulating material (such as silicon nitride) or other suitable insulating materials. As shown in FIG. 7 and FIG. 8, a planarization process 91 may then be performed to the insulating material 30 for removing the insulating material 30 formed outside the trench TR, and the top surface of the insulating material located in the trench TR and the top surface of the capping layer 28 may be substantially coplanar accordingly, but not limited thereto.

As shown in FIGS. 8-10, a patterned mask layer 80 may then be formed on the capping layer 28 and the insulating material 30, and a patterning process 92 using the patterned mask layer 80 as an etching mask may be performed to the insulating material 30, the capping layer 28, the second electrically conductive layer 26, the barrier layer 24, the variable resistance material 22, and the first electrically conductive layer 20. The patterned mask layer 80 may include photoresist or other suitable mask materials, and the patterning process 92 may include one or a plurality of etching steps for etching different materials, respectively, but not limited thereto. The capping layer 28, the second electrically conductive layer 26, the barrier layer 24, the variable resistance material 22, and the first electrically conductive layer 20 may be patterned to be the stacked structure 40 by the patterning process 92, and the insulating material 30 formed in the trench TR may be patterned to be the insulating structure 30S by the patterning process 92. As shown in FIG. 9 and FIG. 2, in some embodiments, the insulating structures 30S disposed adjacent to each other in the direction D2 may be the insulating material 30 formed in the same trench TR extending in the direction D2 before the patterning process described above, and the patterning process described above may be used to remove the insulating material 30 without being covered by the patterned mask layer 80 and form the insulating structures 30S, but not limited thereto. In other words, in some embodiments, the planarization process 91 illustrated in FIG. 8 described above may be performed before the patterning process 92 illustrate in FIG. 10 described above, but not limited thereto. In some embodiments, the patterning process 92 may be performed for forming the stacked structure 40 after the step of forming the insulating structure 30S according to some design considerations. Additionally, the stacked structure 40 and the insulating structure 30S penetrating through the stacked structure 40 in the direction D1 and dividing the stacked structure 40 into the first memory cell unit 40A and the second memory cell unit 40B separated from each other may be formed by the manufacturing method described above, and a top surface 30T of the insulating structure 30S and a top surface 40T of the stacked structure 40 may be substantially coplanar, but not limited thereto. It is worth noting that, in the present invention, the method of forming the insulating structure 30S and the method of forming the stacked structure 40 may include but are not limited to the steps illustrated in FIGS. 3-10 described above. In other words, the insulating structure 30S and the stacked structure 40 illustrated in FIG. 1 may be formed by other approaches according to some design considerations. As shown in FIG. 10 and FIG. 1, after the patterning process 92, the patterned mask layer 80 may be removed, and the spacer structure 42 may be formed on the sidewall of the stacked structure 40 for forming the resistive memory device 101 illustrated in FIG. 1.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 11:
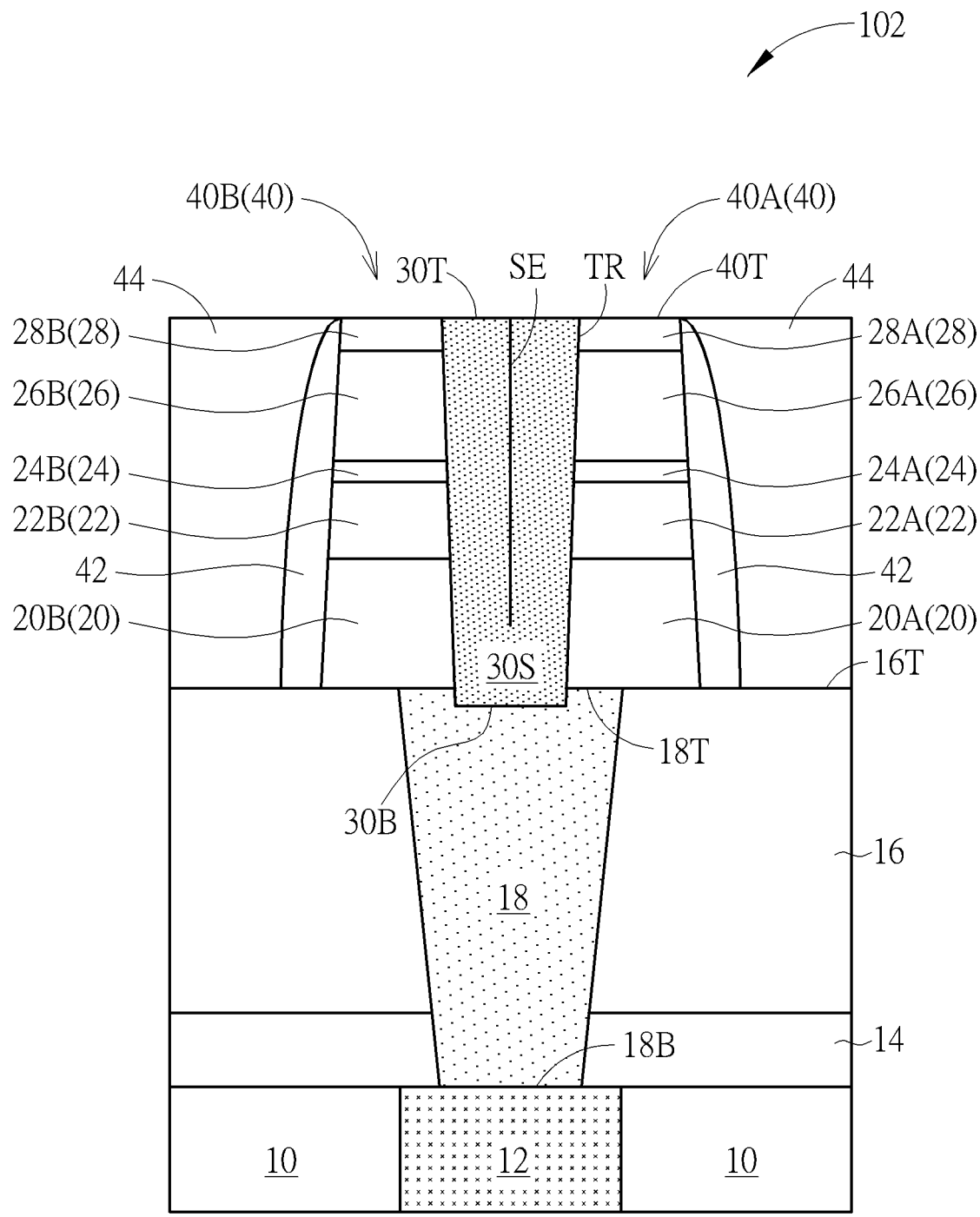
FIG. 11 is a schematic drawing illustrating a resistive memory device according to a second embodiment of the present invention.
Figure 11:
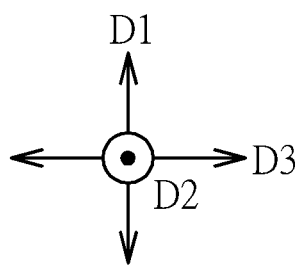

Please refer to FIG. 11. FIG. 11 is a schematic drawing illustrating a resistive memory device 102 according to a second embodiment of the present invention. As shown in FIG. 11, in the resistive memory device 102, the stacked structure 40 may include a trapezoid structure with narrow top and wide bottom in a cross-sectional view of the resistive memory device 102 (such as FIG. 11), and the insulating structure 30S may include an inverted trapezoid structure with wide top and narrow bottom in the cross-sectional view of the resistive memory device 102. In addition, there may be a seam SE in the insulating structure 30S, and an air gap may exist within the seam SE, but not limited thereto. In some embodiments, the resistive memory device 103 may further include a dielectric layer 44 disposed on the dielectric layer 16 and surrounding the spacer structure 42, the stacked structure 40, and the insulating structure 30S in the horizontal directions, and the dielectric layer 44 may include silicon oxide, silicon nitride, or other suitable dielectric materials. It is worth noting that the shape of the stacked structure 40, the shape of the insulating structure 30S, and/or the seam SE within the insulating structure 30S in this embodiment may be applied to other embodiments of the present invention according to some design considerations.

Figure 12:
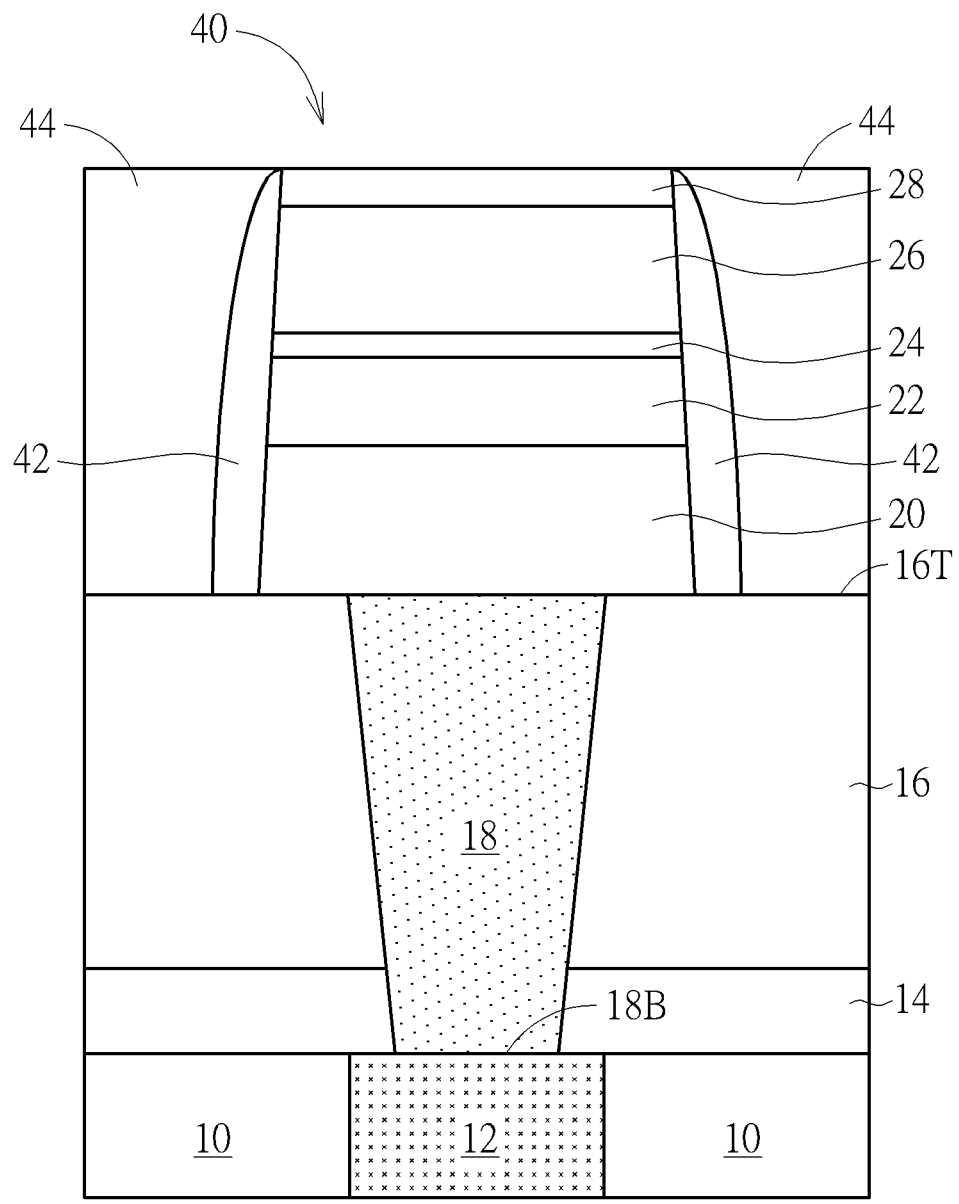
Figure 12:
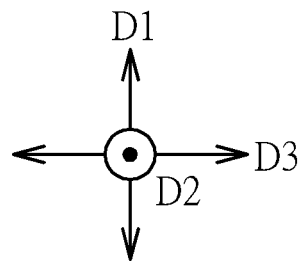
Figure 13:
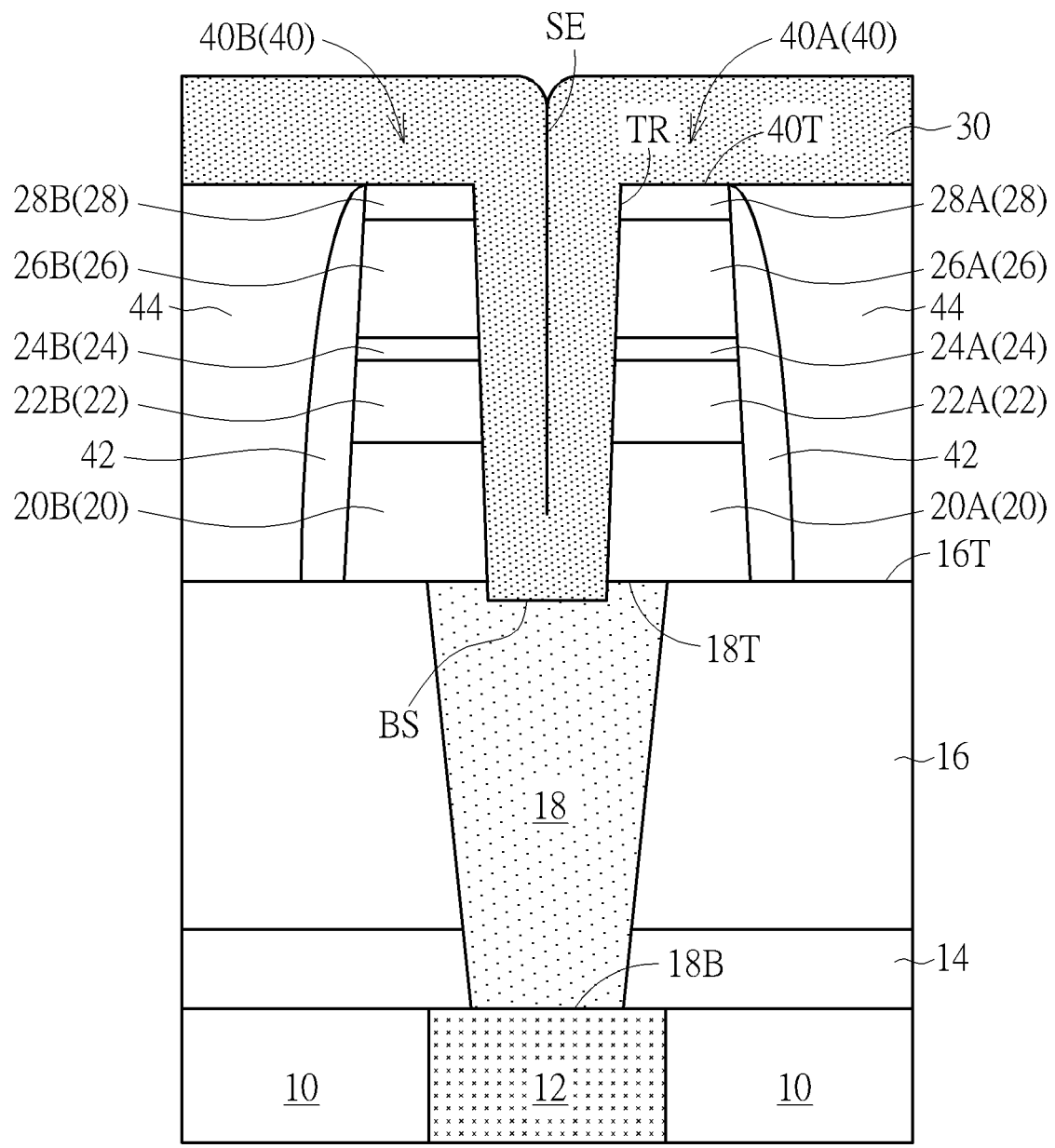
Figure 13:
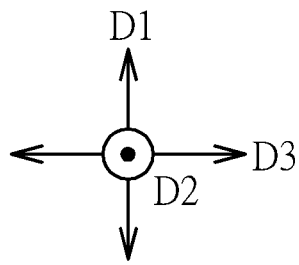

Please refer to FIGS. 11-13. FIG. 12 and FIG. 13 are schematic drawings illustrating a manufacturing method of the resistive memory device according to the second embodiment of the present invention, wherein FIG. 13 is a schematic drawing in a step subsequent to FIG. 12, and FIG. 11 may be regarded as a schematic drawing in a step subsequent to FIG. 13, but not limited thereto. The manufacturing method of the resistive memory device 102 illustrated in FIG. 11 may include but is not limited to the following steps. As shown in FIG. 12, the stacked structure 40, the spacer structure 42, and the dielectric layer 44 may be formed on the dielectric layer 16 and the via connection structure 18, and the stacked structure 40 may be formed by a patterning process similar to the patterning process 92 illustrated in FIG. 10 described above, but not limited thereto. Subsequently, as shown in FIG. 13, the trench TR is formed penetrating through the stacked structure 40 in the direction D1, and the insulating material 30 is formed filling the trench TR. The trench TR may include an inverted trapezoid structure with wide top and narrow bottom in the cross-sectional view, a portion of the insulating material 30 may be formed in the trench TR, and another portion of the insulating material 30 may be formed outside the trench TR. In some embodiments, the insulating material 30 may be formed by an atomic layer deposition (ALD) process or other suitable film forming approaches, and the seam SE may be formed in the insulating material 30 because of the process characteristics when the insulating material 30 is formed by the ALD process, but not limited thereto. Subsequently, the insulating material 30 formed outside the trench TR may be removed by a planarization process similar to the planarization process 91 illustrated in FIG. 8 described above for forming the insulating structure 30S illustrated in FIG. 11. In other words, in some embodiments, the stacked structure 40 may be formed before the step of forming the insulating structure 30S, and the patterning process performed to the insulating material 30 may be performed after the patterning process configured for forming the stacked structure 40.

To summarize the above descriptions, in the resistive memory device and the manufacturing method thereof according to the present invention, the insulating structure penetrating through the stacked structure is used to divide the stacked structure into two memory cell units separated from each other. The purposes of shrinking the dimension of a single memory cell unit, increasing the distribution density of the memory cell units in the resistive memory device, and/or improving the operation efficiency of the resistive memory device may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive memory device, comprising:
   a dielectric layer;
   a via connection structure disposed in the dielectric layer;
   a stacked structure disposed on the via connection structure and the dielectric layer;
   an insulating structure penetrating through the stacked structure in a vertical direction and dividing the stacked structure into a first memory cell unit and a second memory cell unit, wherein the first memory cell unit comprises a first bottom electrode, the second memory cell unit comprises a second bottom electrode separated from the first bottom electrode by the insulating structure, and the via connection structure is electrically connected with the first bottom electrode and the second bottom electrode; and
   a spacer structure disposed on a sidewall of the stacked structure, wherein the insulating structure is directly connected with the spacer structure.

2. The resistive memory device according to claim 1, wherein the stacked structure comprises a first electrically conductive layer, the first bottom electrode is a first portion of the first electrically conductive layer, and the second bottom electrode is a second portion of the first electrically conductive layer.

3. The resistive memory device according to claim 2, wherein the stacked structure further comprises:
   a second electrically conductive layer disposed above the first electrically conductive layer in the vertical direction; and
   a variable resistance material disposed between the first electrically conductive layer and the second electrically conductive layer in the vertical direction, wherein the insulating structure penetrates through the second electrically conductive layer, the variable resistance material, and the first electrically conductive layer in the vertical direction.

4. The resistive memory device according to claim 3, wherein the first memory cell unit further comprises a first top electrode and a first variable resistance layer disposed between the first bottom electrode and the first top electrode in the vertical direction, and the second memory cell unit further comprises a second top electrode and a second variable resistance layer disposed between the second bottom electrode and the second top electrode in the vertical direction.

5. The resistive memory device according to claim 4, wherein the first variable resistance layer is a first portion of the variable resistance material, and the second variable resistance layer is a second portion of the variable resistance material separated from the first portion of the variable resistance material by the insulating structure.

6. The resistive memory device according to claim 4, wherein the first top electrode is a first portion of the second electrically conductive layer, and the second top electrode is a second portion of the second electrically conductive layer separated from the first portion of the second electrically conductive layer by the insulating structure.

7. The resistive memory device according to claim 4, wherein the insulating structure is directly connected with the first bottom electrode, the second bottom electrode, the first variable resistance layer, the second variable resistance layer, the first top electrode, the second top electrode, and the via connection structure.

8. The resistive memory device according to claim 1, wherein the insulating structure is disposed on the via connection structure in the vertical direction, and a bottom surface of the insulating structure is lower than a top surface of the via connection structure in the vertical direction.

9. The resistive memory device according to claim 1, further comprising:
   a seam in the insulating structure.

10. The resistive memory device according to claim 1, wherein the spacer structure surrounds the stacked structure in a direction perpendicular to the vertical direction.

11. A manufacturing method of a resistive memory device, comprising:
    forming a via connection structure in a dielectric layer;
    forming a stacked structure on the via connection structure and the dielectric layer;
    forming an insulating structure, wherein the insulating structure penetrates through the stacked structure in a vertical direction and divides the stacked structure into a first memory cell unit and a second memory cell unit, wherein the first memory cell unit comprises a first bottom electrode, the second memory cell unit comprises a second bottom electrode separated from the first bottom electrode by the insulating structure, and the via connection structure is electrically connected with the first bottom electrode and the second bottom electrode; and
    forming a spacer structure on a sidewall of the stacked structure, wherein the insulating structure is directly connected with the spacer structure.

12. The manufacturing method of the resistive memory device according to claim 11, wherein a method of forming the stacked structure comprises:
    forming a first electrically conductive layer on the via connection structure and the dielectric layer;

forming a variable resistance material on the first electrically conductive layer;

forming a second electrically conductive layer on the variable resistance material; and performing a patterning process to the second electrically conductive layer, the variable resistance material, and the first electrically conductive layer, wherein the second electrically conductive layer, the variable resistance material, and the first electrically conductive layer are patterned to be at least a portion of the stacked structure by the patterning process.

13. The manufacturing method of the resistive memory device according to claim 12, wherein a method of forming the insulating structure comprises:

forming a trench penetrating through the second electrically conductive layer, the variable resistance material, and the first electrically conductive layer in the vertical direction;

forming an insulating material, wherein a portion of the insulating material is formed in the trench, and another portion of the insulating material is formed outside the trench; and performing a planarization process to the insulating material, wherein the insulating material formed outside the trench is removed by the planarization process.

14. The manufacturing method of the resistive memory device according to claim 13, wherein a portion of the via connection structure is removed by the step of forming the trench, and a bottom surface of the insulating structure is lower than a top surface of the via connection structure in the vertical direction.

15. The manufacturing method of the resistive memory device according to claim 13, wherein the planarization process is performed before the patterning process, and the insulating material formed in the trench is patterned to be the insulating structure by the patterning process.

16. The manufacturing method of the resistive memory device according to claim 12, wherein the first bottom electrode is a first portion of the first electrically conductive layer, and the second bottom electrode is a second portion of the first electrically conductive layer.

17. The manufacturing method of the resistive memory device according to claim 12, wherein the first memory cell unit further comprises a first top electrode and a first variable resistance layer disposed between the first bottom electrode and the first top electrode in the vertical direction, and the second memory cell unit further comprises a second top electrode and a second variable resistance layer disposed between the second bottom electrode and the second top electrode in the vertical direction.

18. The manufacturing method of the resistive memory device according to claim 17, wherein the first variable resistance layer is a first portion of the variable resistance material, and the second variable resistance layer is a second portion of the variable resistance material separated from the first portion of the variable resistance material by the insulating structure.

19. The manufacturing method of the resistive memory device according to claim 17, wherein the first top electrode is a first portion of the second electrically conductive layer, and the second top electrode is a second portion of the second electrically conductive layer separated from the first portion of the second electrically conductive layer by the insulating structure.

20. A resistive memory device, comprising:

a dielectric layer;

a via connection structure disposed in the dielectric layer;

a stacked structure disposed on the via connection structure and the dielectric layer; and an insulating structure penetrating through the stacked structure in a vertical direction and dividing the stacked structure into a first memory cell unit and a second memory cell unit, wherein the first memory cell unit comprises a first bottom electrode, the second memory cell unit comprises a second bottom electrode separated from the first bottom electrode by the insulating structure, and the via connection structure is electrically connected with the first bottom electrode and the second bottom electrode, wherein the insulating structure is disposed on the via connection structure in the vertical direction, and a bottom surface of the insulating structure is lower than a top surface of the via connection structure in the vertical direction.

* * * * *